(12) United States Patent
Shimada et al.

(10) Patent No.: US 6,489,669 B2
(45) Date of Patent: Dec. 3, 2002

(54) INTEGRATED CIRCUIT DEVICE

(75) Inventors: Yoshikazu Shimada, Kyoto (JP); Hiroo Mochida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/938,498

(22) Filed: Aug. 27, 2001

(65) Prior Publication Data

US 2002/0030264 A1 Mar. 14, 2002

(30) Foreign Application Priority Data

Sep. 11, 2000 (JP) ........................................ 2000-274351

(51) Int. Cl.[7] .................... H01L 23/02; H01L 23/48; H01L 23/52; H01L 29/40; H05K 7/14; H05K 7/15

(52) U.S. Cl. ...................... 257/686; 257/777; 257/778; 361/800

(58) Field of Search ................................ 438/108, 129; 257/686, 777, 778, 725, 729, 660, 659; 361/800, 751, 761

(56) References Cited

U.S. PATENT DOCUMENTS

| | | | |
|---|---|---|---|
| 5,198,963 A | * | 3/1993 | Gupta et al. ................ 257/737 |
| 5,608,262 A | * | 3/1997 | Degani et al. ............... 257/723 |
| 6,154,370 A | * | 11/2000 | Degani et al. ............... 257/723 |
| 6,297,551 B1 | * | 10/2001 | Dudderar et al. ........... 257/686 |

* cited by examiner

*Primary Examiner*—Olik Chaudhuri
*Assistant Examiner*—Timothy Sutton
(74) *Attorney, Agent, or Firm*—Arent Fox Kintner Plotkin & Kahn

(57) ABSTRACT

An integrated circuit device as a first IC chip, a second IC chip, and a circuit board having a hole formed therein that is large enough to permit the second IC chip to be accommodated therein. The first and second IC chips are bonded together so as to be electrically connected together, and the first IC chip is mounted on the circuit board with the second IC chip accommodated in the hole formed in the circuit board. Here, one of the IC chips forming a chip-on-chip structure is accommodated in the hole formed in the circuit board, making further thickness reduction possible. Moreover, the obverse surfaces of the IC chips are located closer to the circuit board, making possible wireless mounting of the IC chips, despite forming a chip-on-chip structure, on the circuit board through connection using bumps. This helps reduce trouble due to inductance in a circuit that handles a high-frequency signal.

6 Claims, 5 Drawing Sheets

INTEGRATED CIRCUIT DEVICE

BACKGROUND OF THE INVENTION

1. Field of the Invention

The present invention relates to an integrated circuit device having IC chips forming a so-called chip-on-chip structure, in which two IC chips are bonded together through bumps or by another means so as to be electrically connected together.

2. Description of the Prior Art

Conventionally, when two semiconductor chips are mounted on a circuit board, they are sometimes bonded together through bumps or by another means so as to be electrically connected together (hereinafter referred to as a "chip-on-chip structure"). As compared with mounting two chips separately, adopting a chip-on-chip structure offers the advantage of making of the area required on a circuit board smaller.

However, conventionally, as shown in FIG. 7, IC chips 100 and 200 forming a chip-on-chip structure are usually simply placed on a circuit board 300, and thus tend to increase the overall thickness. Moreover, the obverse surface of the IC chip 100 (i.e. that surface of the IC chip 100 to which the IC chip 200 is bonded and on which electrodes are provided) faces away from the circuit board 300, and therefore the wiring pattern (not shown) formed on the circuit board 300 needs to be connected to the IC chip 100 by the use of wires 400 such as gold wires. As a result, in particular in the case of a circuit that handles a high-frequency signal, the inductance of the wires 400 tend to cause poor or uneven sensitivity.

Moreover, in the case of a circuit that handles a high-frequency signal, it is essential to provide shielding against noise. Conventionally, as shown in FIG. 8, such shielding is realized by the use of shielding material 500. Providing shielding in this way, however, not only requires a large amount of shielding material, and thus hampers cost reduction and weight reduction, but also further increases the overall thickness. This often makes an arrangement like this unusable in thin devices such as IC cards and cellular telephones.

SUMMARY OF THE INVENTION

An object of the present invention is to provide an integrated circuit device having IC chips forming a chip-on-chip structure that helps achieve further thickness reduction and that minimizes trouble due to inductance in a case where a high-frequency signal is handled.

Another object of the present invention is to provide an integrated circuit device having IC chips forming a chip-on-chip structure that reduces the amount of shielding material required, or even eliminates the need therefor, in providing necessary shielding and thereby helps achieve cost reduction and weight reduction.

To achieve the above objects, according to one aspect of the present invention, an integrated circuit device is provided with a first IC chip, a second IC chip, and a circuit board having a hole formed therein that is large enough to permit the second IC chip to be accommodated therein. Here, the first and second IC chips are bonded together so as to be electrically connected together, and the first IC chip is mounted on the circuit board with the second IC chip accommodated in the hole formed in the circuit board.

In this arrangement, one of the IC chips forming a chip-on-chip structure is accommodated in the hole formed in the circuit board. This helps achieve further thickness reduction. In addition, the obverse surfaces of the IC chips (i.e. the surfaces on which the IC chips are bonded together) are located closer to the circuit board. This makes it possible to mount the IC chips, even though they form a chip-on-chip structure, on the circuit board on a wireless basis (without using wires), i.e. through connection using bumps or by another means. In this way, it is possible to reduce trouble due to inductance in a circuit that handles a high-frequency signal.

The circuit board may have shielding pattern formed around the portion thereof where the first IC chip is connected to the circuit board. This makes it possible to shield the noise coming from where the IC chip is connected to the circuit board, and thus helps enhance the shielding effect.

Shielding material connected to fixed potential point may be provided in the hole formed in the circuit board. This permits the portion of the circuit board on which the IC chips forming a chip-on-chip structure are mounted to be surrounded by the shielding material connected to the fixed potential point and by the reverse surfaces of the IC chips (the surfaces of the IC chips opposite to the surfaces thereof on which they are bonded together), which also offer a shielding effect. Thus, it is possible to obtain a sufficient shielding effect.

The shielding material has only to be somewhat larger than the smaller of the IC chips forming a chip-on-chip structure. This helps reduce the amount of shielding material required as compared with conventional arrangements and thereby achieve cost reduction and eight reduction. By making the shielding material somewhat larger than the larger of the IC chips forming a chip-on-chip structure, it is possible to obtain a higher shielding effect.

According to another aspect of the present invention, an integrated circuit device is provided with a first IC chip, a second IC chip, and a multilayer circuit board having a recess formed therein that is large enough to permit the second IC chip to be accommodated therein. Here, the first and second IC chips are bonded together so as to be electrically connected together, and the first IC chip is mounted on the multilayer circuit board with the second IC chip accommodated in the recess formed in the multilayer circuit board. Moreover, a wiring pattern connected to a fixed potential point is formed around the recess formed in the multilayer circuit board.

In this arrangement, one of the IC chips forming a chip-on-chip structure is accommodated in the recess formed in the multilayer circuit board. This helps achieve further thickness reduction. In addition, the portion of the multilayer circuit board on which the IC chips forming a chip-on-chip structure are mounted is surrounded by the wiring pattern connected to the fixed potential point and formed inside the multilayer circuit board and by the reverse surfaces of the IC chips (the surfaces of the IC chips opposite to the surfaces thereof on which they are bonded together), which also offer a shielding effect. Thus, it is possible to obtain a sufficient shielding effect. Since the wiring pattern formed inside the multilayer circuit board is used as shielding material, there is no need to provide shielding material separately, and thus it is possible to achieve further cost reduction and weight reduction.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE REFERRED EMBODIMENTS

Figure 1A:
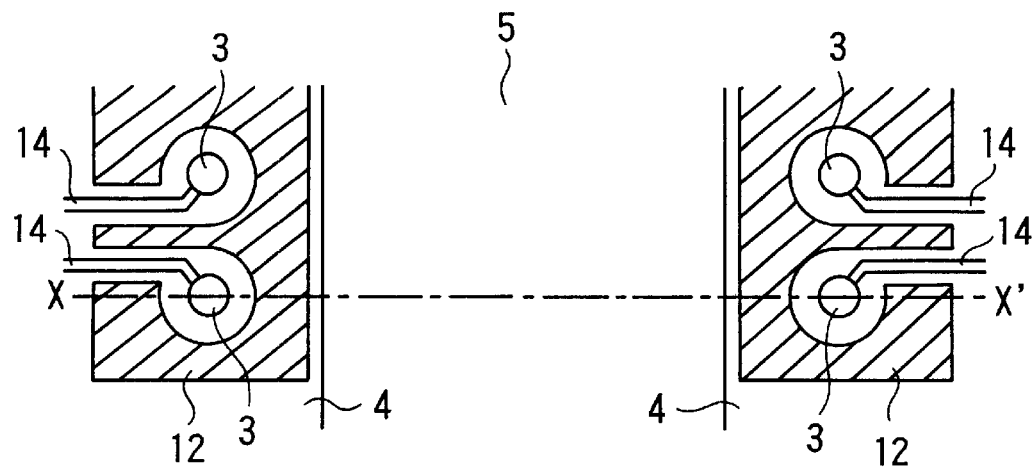
FIG. 1A is a top view of the circuit board of the integrated circuit device of a first embodiment of the invention.
Figure 1B:
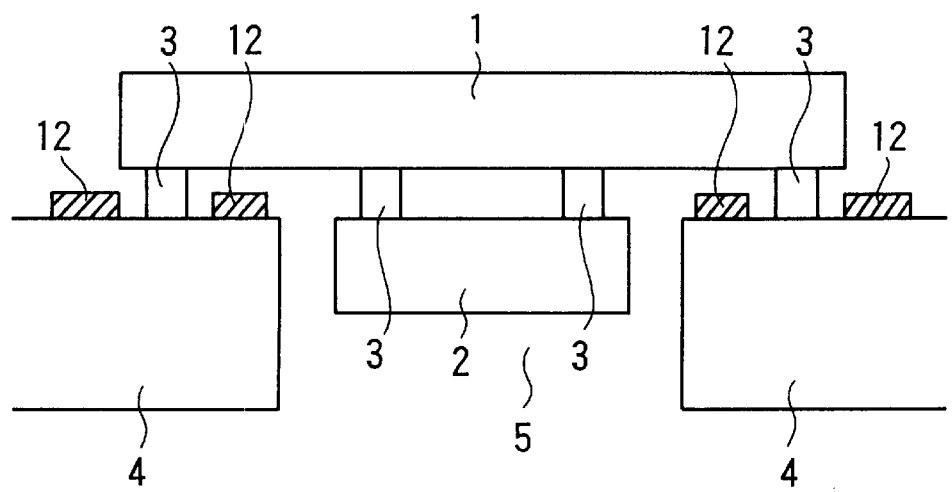
FIG. 1B is a sectional view of the integrated circuit device of the first embodiment.

Hereinafter, embodiments of the present invention will be described with reference to the drawings. FIG. 1A is a top view of the circuit board (in its state before IC chips are mounted thereon) of the integrated circuit device of a first embodiment of the invention. FIG. 1B is a sectional view taken along line X–X' shown in FIG. 1A.

In the first embodiment, a chip-on-chip structure is formed by electrically connecting together a first IC chip 1 and second IC chip 2 through bumps 3 such as gold bumps. Wiring patterns 14 are aid so as to originate respectively from bumps 3 formed on a circuit board 4. The circuit board 4 is made of resin, ceramics, or the like, and has a through hole formed therein so as to be large enough to accommodate the second IC chip 2, i.e. the smaller of the two IC chips, therein.

The first IC chip 1 is so positioned that the second IC chip 2 is accommodated in the through hole 5 formed in the circuit board 4, and is electrically connected to the wiring pattern 14 formed on the circuit board 4 through the bumps 3 on a wireless basis (without using wires). Moreover, on the circuit board 4, a wiring pattern 12 connected to a fixed potential point, such as ground, is formed around the bump 3 provided for connection with the first IC chip 1.

In this first embodiment, one of the IC chips forming a chip-on-chip structure is accommodated in the through hole formed in the circuit board. This helps achieve further thickness reduction. Moreover, the IC chips are electrically connected to the wiring patterns formed on the circuit board on a wireless basis (without using wires). This helps reduce trouble due to inductance in a circuit that handles a high-frequency signal. Furthermore, the noise coming from where the first IC chip 1 is connected to the circuit board 4 is shielded by the wiring pattern 12. This enhances the shielding effect.

Figure 2:
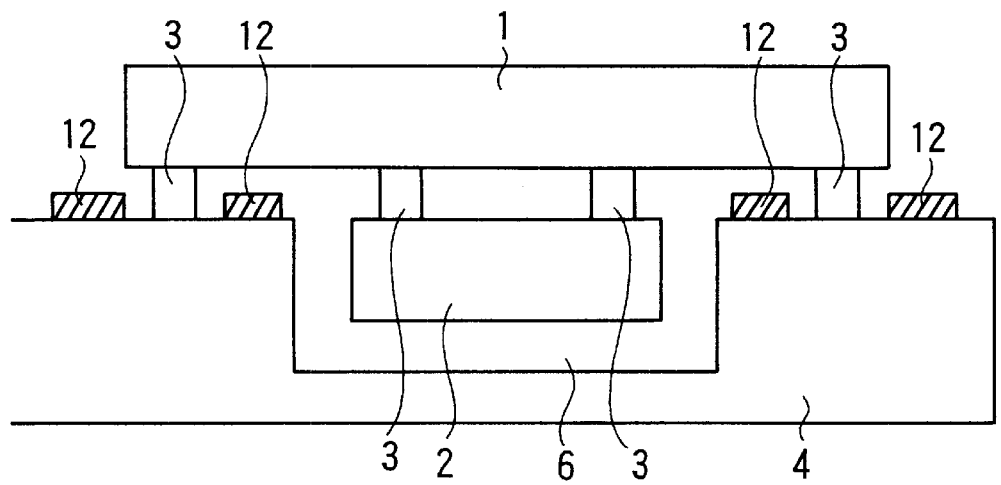
FIG. 2 is a sectional view of a modified example of the integrated circuit device of the first embodiment.

As shown in FIG. 2, instead of forming the through hole 5 in the circuit board 4, it is also possible to form a recess 6 in the circuit board 4 and connect the first IC chip 1 to the circuit board 4 through the bumps with the second IC chip 2 accommodated in that recess 6.

Figure 3:
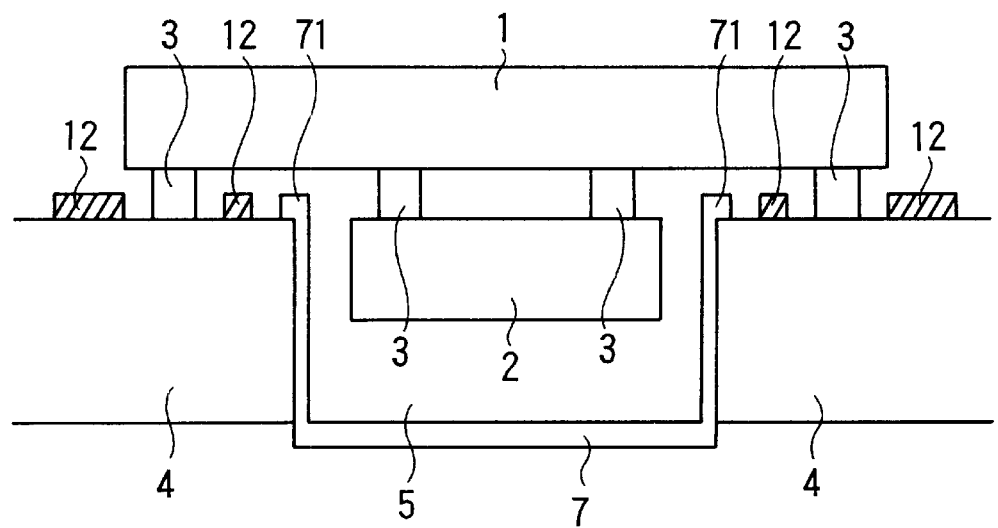
FIG. 3 is a sectional view of the integrated circuit device of a second embodiment of the invention.

FIG. 3 is a sectional view of the integrated circuit device of a second embodiment of the invention. Here, such elements as are found also in the first embodiment described above are identified with the same reference symbols, and their explanations will not be repeated. The circuit board of the integrated circuit device of the second embodiment has the same top view as in the first embodiment, i.e. as shown in FIG. 1A. The second embodiment differs from the first embodiment in that shielding material 7 that is so shaped as to cover the side and bottom of the through hole 5 is fitted into the through hole 5 so as to be fixed thereto.

The shielding material 7 is connected to a fixed potential point, such as ground. To make the positioning and fixing of the shielding material 7 easier, it has a portion thereof formed into a stopper portion 71, i.e. a portion having a larger external diameter than the diameter of the through hole 5. Examples of the shielding material 7 include, to name a few, copper, aluminum, and iron.

Figure 4:
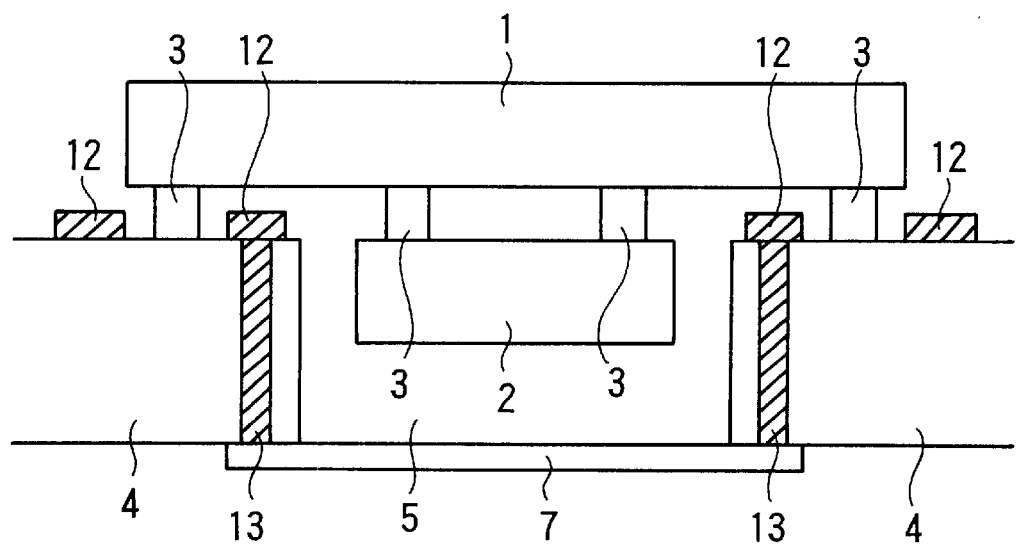
FIG. 4 is a sectional view of a modified example of the integrated circuit device of the second embodiment.
Figure 5:
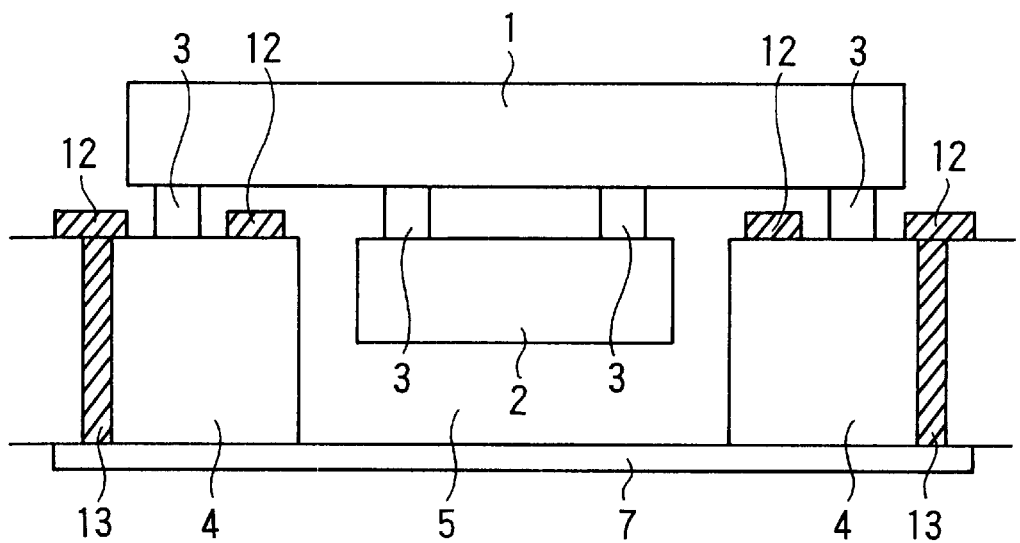
FIG. 5 is a sectional view of another modified example of the integrated circuit device of the second embodiment.

Alternatively, as shown in FIG. 4, it is also possible to cover only an area around the bottom of the through hole 5 with shielding material 7 formed so as to be somewhat larger than the diameter of the through hole 5. In this case, the shielding material 7 may be connected to the wiring pattern 12 via through holes 13. Alternatively, as shown in FIG. 5, it is also possible to cover only an area around the bottom of the through hole 5 with shielding material 7 formed so as to be somewhat larger than the first IC chip 1.

In this second embodiment, the portion of the circuit board on which the first and second IC chips 1 and 2 are mounted is surrounded by the shielding material 7 connected to the fixed potential point and by the reverse surface of the first IC chip 1 (the surface of the first IC chip 1 opposite to the surface thereof to which the second IC chip 2 is bonded), which also offers a shielding effect. Thus, it is possible to obtain a sufficient shielding effect.

Moreover, the shielding material 7 has only to be at least somewhat larger than the second IC chip 2, i.e. the smaller of the two IC chips, up to about the size of the first IC chip 1. This helps reduce the amount of shielding material required and thereby achieve cost reduction and weight reduction. By making the shielding material 7 somewhat larger than the first IC chip 1 as shown in FIG. 5, it is possible to expect a higher shielding effect.

Figure 6:
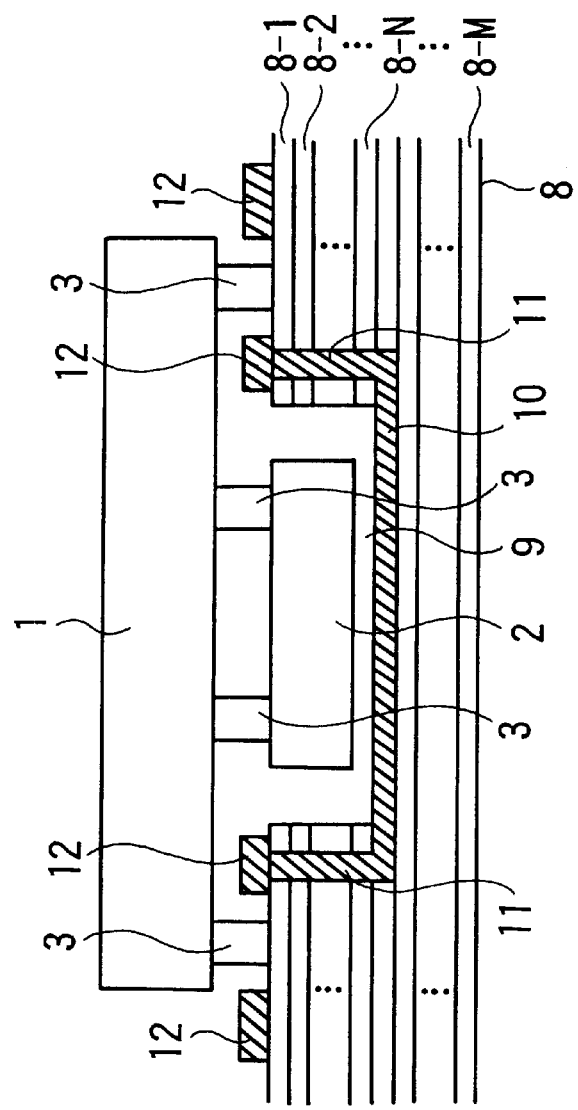
FIG. 6 is a sectional view of the integrated circuit device of a third embodiment of the invention.
Figure 7:
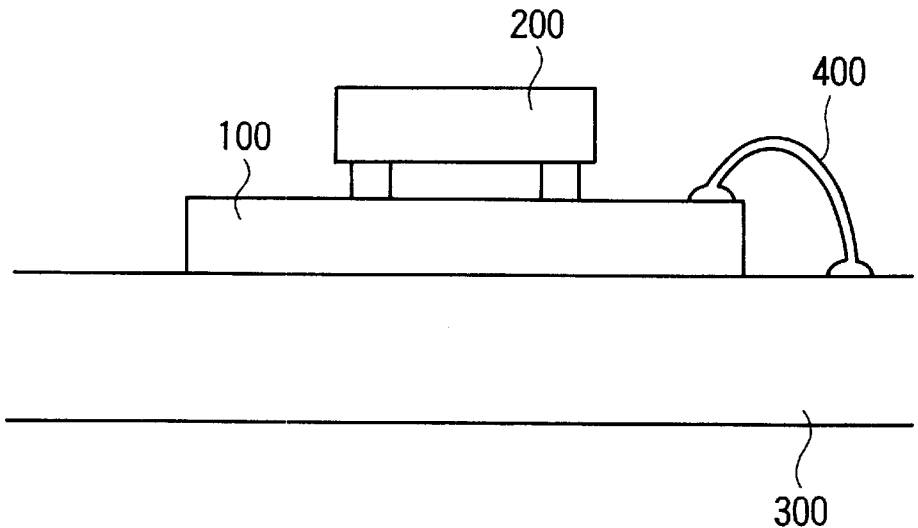
FIG. 7 is sectional view of a conventional integrated circuit device having a chip-on-chip structure.
Figure 8:
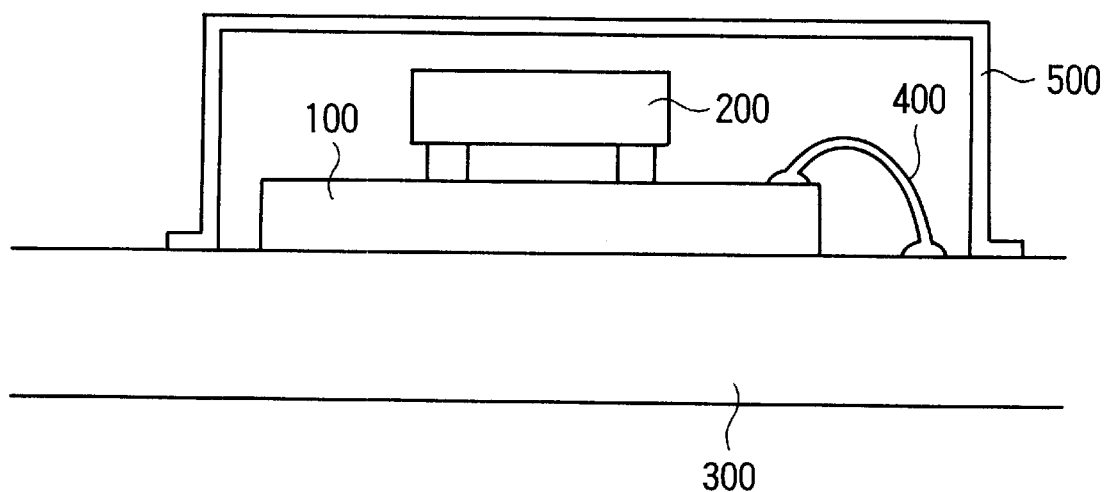
FIG. 8 is a sectional view of the conventional integrated circuit device having a chip-on-chip structure, provided additionally with a shield.

FIG. 6 is a sectional view of the integrated circuit device of a third embodiment of the invention. Here, such elements as are found also in the first embodiment described earlier are identified with the same reference symbols, and their explanations will not be repeated. The circuit board of the integrated circuit device of the third embodiment has the same top view as in the first embodiment, i.e. as shown in FIG. 1A. Reference numeral 8 represents a multilayer circuit board consisting of M layers 8-1, 8-2, . . . , 8-M. This multilayer circuit board 8 has a recess 9 formed therein by cutting out the corresponding portions of the first layer 8-1 to the N-th layer 8-N thereof so as to be large enough to accommodate the second IC chip 2.

In the circuit board 8, a wiring pattern 10 and via conductors (layer-to-layer contacts) 11 are formed so as to surround the recess 9. The wiring pattern 10 and the via conductors 11 conduct to the wiring pattern 12, which is connected to the fixed potential point, such as ground. The first IC chip 1 is positioned in such a way that the second IC chip 2 is accommodated in the recess 9 formed in the multilayer circuit board 8, and is electrically connected to the wiring patterns 14 formed on the circuit board 8 through the bumps 3 on a wireless basis (without using wires).

In this third embodiment, the portion of the circuit board on which the first and second IC chips 1 and 2 are mounted is surrounded by the wiring pattern 10 and the via conductors 11 connected to the fixed potential point and by the reverse surface of the first IC chip 1 the surface of the first IC chip 1 opposite to the surface thereof to which the second IC chip 2 is bonded), which also offers a shielding effect. Thus, it is possible to obtain a sufficient shielding effect. Moreover, a wiring pattern formed in the multilayer circuit board 8 is used as shielding material, and therefore there is no need to provide shielding material separately. This makes it possible to achieve further cost reduction and weight reduction.

What is claimed is:

1. An integrated device comprising:

a first IC chip;

a second IC chip; and a circuit board having a hole formed the in that is large enough to permit the second IC chip to be accommodated therein, wherein the first and second IC chips are bonded together so as to be electrically connected together, wherein the first IC chip is mounted on the circuit board and the second IC chip accommodated in the hole formed in the circuit board, and a shielding pattern is formed around at least a part of connection portions at which the circuit board is connected the first IC chip.

2. An integrated circuit device as claimed in claim 1, wherein shielding material is laid on the circuit board in such a way as to cover the hole formed in the circuit board from a side of the circuit board opposite to a side thereof on which the first IC chip is mounted, and a through hole is formed in the circuit board so that the shielding pattern and the shielding material are connected together through the through hole.

3. An integrated device as claimed in claim 1, wherein shielding material connected to a fixed potential point is provided in the hole formed in the circuit board.

4. An integrated circuit device comprising:

a first IC chip;

a second IC chip; and a multilayer circuit board having a recess formed therein so as to penetrate a plurality of circuit boards constituting the multilayer board and be large enough to permit the second IC chip to be accommodated therein, wherein the first and second IC chips are bonded together so as to be electrically connected together, the first IC chip is mounted on the multilayer circuit board with the second IC chip accommodated in the recess formed in the multilayer circuit board, and conductive material connected to a fixed potential point is formed around the recess formed in the multilayer circuit board.

5. An integrated circuit device as claimed in claim 4, wherein the multilayer circuit board has a shielding pattern formed around a portion thereof where the first IC chip is connected to the multilayer circuit board.

6. An integrated circuit device is claimed in claim 5, wherein the conductive material formed around the recess formed in the multilayer circuit board conducts to the shielding pattern.

* * * * *